Dec. 9, 1969 P. VILLERS 3,483,045

THERMOPILE AND LEAD STRUCTURE

Filed May 25, 1965

INVENTOR.
PHILIPPE VILLERS

BY

ATTORNEY

United States Patent Office 3,483,045
Patented Dec. 9, 1969

3,483,045
THERMOPILE AND LEAD STRUCTURE

Philippe Villers, Wilton, Conn., assignor to Barnes Engineering Company, Stamford, Conn., a corporation of Delaware

Filed May 25, 1965, Ser. No. 458,712
Int. Cl. H01l *15/02;* H01v *1/02*
U.S. Cl. 136—225 8 Claims

ABSTRACT OF THE DISCLOSURE

An improved thin film thermopile is formed on a thin insulating substrate which is shaped to conform to the thermopile shape and which extends as a long tail. Thin flexible foil leads are deposited on the tail and preferably are protected with insulating sheets on both sides of the tail forming with the leads a sandwich. Solid backed thermoplies in which the substrate is mounted on a heat sink of high thermal conductivity with recesses or openings under the active junctions and the reference junctions of the thermopile being in good thermal contact with the heat sink is the preferred form of thermopile.

BACKGROUND OF THE INVENTION

Thermopiles have achieved increasing success as radiation detectors, particularly for the infrared, and such other radiations where a thermal detector which is not wavelength sensitive is desirable. The most common form of thermopile for instruments which require chopped or interrupted radiation and rugged construction is a so-called solid-backed thermopile.

In a solid-backed thermopile, a heat sink of suitable high thermal conductivity material, such as a block of aluminum, is provided with an area which is recessed, or an opening through the substrate. Over the recess, and bridging it onto the sides of the heat sink, is a thin film of electrically insulating material, the preferred material being polyglycol terephthalate, which is sold in the trade under the trade name "Mylar." For simplicity, the trade name will be referred to through the specification. The thickness may vary from .25 to 1 mil, or slightly thicker. Other materials may be used of suitable characteristics, such as, for example, polyolefin sheets, but because of its excellent mechanical and electrical characteristics, Mylar is usually preferred.

On the Mylar sheet there is formed to thermopile proper, usually by vacuum deposition through successive masks of thin films of bismuth and antimony, to form successive junctions in series to produce the thermopile. The active junctions are over the recess, or opening of the substrate, and the reference junctions are on a portion of the Mylar which is in direct heat exchanging contact with the substrate. The thermopiles may take various shapes, such as rectangular, radial, and the like, the latter being preferred for many purposes.

In the thermopiles in the past, whether solid-backed or not, considerable problems have been encountered with attachments of the final leads to the thin bismuth and antimony films. Various methods have been used, such as silver paste, for example, an epoxy cement and the like. In every case the junction of the electrical leads to the thermopile has presented a weak spot, and many times thermopiles have been discarded because leads broke off. This is a particularly serious problem if the thermopile is used in instruments which have to be operative for long times unattended, as for example, in space vehicles.

SUMMARY OF THE INVENTION

The invention solves the lead problems described above. Essentially a thin Mylar substrate are formed in a shape corresponding to the thermopile, with a long, narrow tail. On this tail there are then formed flexible leads by the use of foil or other printed circuit techniques, or by vacuum deposition of metal such as gold or the like. After the leads have been formed on the Mylar tail, they can then be covered by cementing on another piece of Mylar, which may be heavier, or other suitable plastic. The resulting sandwich is extremely rugged, it is flexible, does not break under conditions of severe vibration, and in general transforms the thermopile leads from a source of weakness to one of the most rugged parts of the whole thermopile. It should be noted that the present invention is utilizing the same Mylar layer as a lead substrate and as a substrate for the vacuum deposition of the thermopile junctions themselves. In fact, it is possible even to vacuum deposit the leads in the same two operations that the different junction materials are deposited. This is practical in the case of antimony-bismuth thermopiles, which are preferred for many uses, but is somewhat less suitable for more brittle materials. In general, leads of different materials, such as copper or gold, are preferred, and have certain economic advantages. However, the invention is in no sense limited to the particular metal of which the leads are formed. It is an advantage of the present invention that a single Mylar shape with the proper tail can be used, which is cheap, and forms a very satisfactory flexible lead.

While not essential to the new configuration of the Mylar sheet, it is often desirable to provide additional locking means to prevent the Mylar sheet from being peeled off from the substrate. This can be effected by providing tabs extending either from the sheet or from a covering sheet over recesses in the substrate into which they are bent down and fastened by cement. It is a characteristic of cements, such as epoxy cements, that they have great shear strength and they are, therefore, capable of locking the tabs on at least one side of the recesses thereby increasing the strength of the thermopile. This is a preferred type of construction.

DESCRIPTION OF THE PREFERRED EMBODIMENTS

Figure 1:
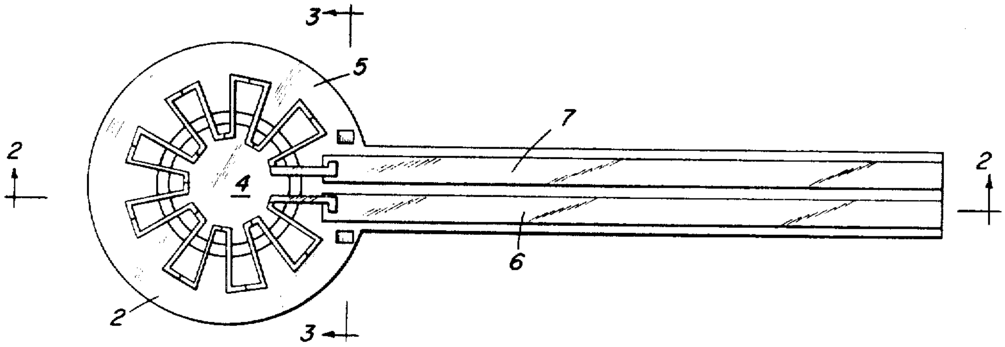
FIG. 1 is a plan view of a thermopile and lead with the cover layer removed.
Figure 2:
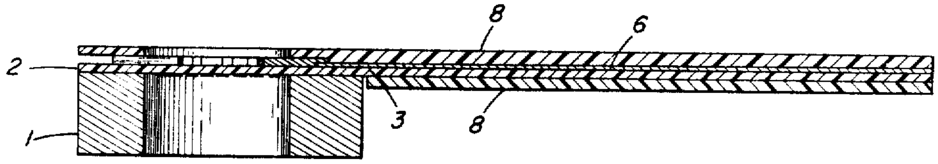
FIG. 2 is a vertical section along the line 2—2 of FIG. 1.

FIG. 2 shows a heat sink of aluminum 1 with a central opening. A layer of Mylar 2 bridges across the opening and extends on to form a tail 3. On the top of the Mylar layer there is formed the junctions of the thermopile, using antimony and bismuth. The active junctions extend into the area 4 which is above the opening in the substrate 1. The reference junctions are in heat-conducting relationship to the heat sink 1 through the portion 5 of the Mylar sheet. The shape of the portion of the Mylar sheet which covers the heat sink will be seen to be the same as that of the thermopile but somewhat larger in diameter.

On the tail there is vacuum deposited, plated or bonded two thin conductors 6 and 7, extending from the end junctions of the thermopile. Two covers of somewhat heavier Mylar, for example 5 mil, are shown at 8, which protect the leads and form a flexible sandwich which is rugged and does not present the problem of lead breakage where it is attached to the thermopile. The leads 6 and 7 may be first applied to the tail, and the end junctions of antimony and bismuth vacuum deposited thereon. This method of attachment is preferred, but it is of course also possible to vacuum deposit the leads 6 and 7 after the thermopile junctions have been laid down. It will be noted that the vacuum deposited leads are very thin and would not be self-supporting.

Figure 3:
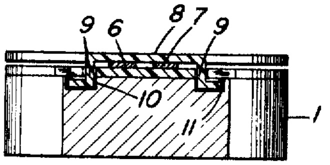
FIG. 3 is a detail section along the line 3—3 of FIG. 1.

The top cover 8 is provided with tabs 9 which are bent down into and fit recesses 10 in the aluminum heat sink 1 and are locked into position with epoxy cement 11. This is best illustrated in FIG. 3. The tabs serve as an additional lock and eliminate dangers of peeling of the Mylar from the aluminum heat sink.

I claim:

1. A thermopile and lead structure, the thermopile having active junction elements in the form of thin films comprising in combination (a) a unitary insulating substrate sheet of .25 to 1 mil in thickness having a section of shape conforming to the thermopile outline and a relatively narrower long tail, (b) at least one thermopile on said section of conforming shape, the thermopile junctions being extended in area and so thin as to be non-self-supporting, the mass of the thermopile being sufficiently small for measurement of electromagnetic radiation, and (c) leads in the form of thin foils from the end junctions of the thermopile extending along the tail of the insulating substrate sheet.

2. A thermopile according to claim 1 in which the leads are covered with at least one other sheet of insulating material to form a sandwich.

3. A solid-backed thermopile according to claim 1 in which the insulating substrate sheet is mounted on a heat sink having the portion of the heat sink underneath the active junctions of the thermopile out of contact with the insulating sheet.

4. A solid-backed thermopile according to claim 2 in which the insulating substrate sheet is mounted on a heat sink having the portion of the heat sink underneath the active junctions of the thermopile out of contact with the insulating sheet.

5. A solid-backed thermopile according to claim 3 in which the portion of the heat sink underneath the active junctions is an opening, and the tail of the sheet extends beyond the periphery of the heat sink.

6. A solid-backed thermopile according to claim 4 in which the portion of the heat sink underneath the active junctions is an opening, and the tail of the sheet extends beyond the periphery of the heat sink.

7. A thermopile according to claim 3 comprising tabs uniformly extending from the insulating substrate sheet and recesses in the heat sink positioned to receive said tabs and cementing means cementing the tabs to the substrate.

8. A thermopile according to claim 7 in which a cover sheet is cemented over the leads on the tail and the tabs extend from said cover sheet.

References Cited

UNITED STATES PATENTS 3,031,888 5/1962 Wilhelm ---------- 136—230 X

FOREIGN PATENTS 724,888 1/1966 Canada.

OTHER REFERENCES

Klass, P. J., "New Thin-Film Infrared Sensor Developed," Aviation Week & Space Technology, May 20, 1963, pp. 91–97.

WINSTON A. DOUGLAS, Primary Examiner

M. J. ANDREWS, Assistant Examiner